(12) United States Patent
Manassen et al.

(10) Patent No.: US 12,399,435 B2
(45) Date of Patent: Aug. 26, 2025

(54) GRATING-OVER-GRATING OVERLAY MEASUREMENT WITH PARALLEL COLOR PER LAYER

(71) Applicant: KLA Corporation, Milpitas, CA (US)

(72) Inventors: Amnon Manassen, Haifa (IL); Yonatan Vaknin, Yoqneam Llit (IL)

(73) Assignee: KLA Corporation, Milpitas, CA (US)

( * ) Notice: Subject to any disclaimer, the term of this patent is extended or adjusted under 35 U.S.C. 154(b) by 255 days.

(21) Appl. No.: 18/212,049

(22) Filed: Jun. 20, 2023

(65) Prior Publication Data
US 2024/0427252 A1 Dec. 26, 2024

(51) Int. Cl.
*G03F 7/20* (2006.01)
*G03F 7/00* (2006.01)

(52) U.S. Cl.
CPC .... *G03F 7/70633* (2013.01); *G03F 7/706849* (2023.05); *G03F 7/706851* (2023.05)

(58) Field of Classification Search
CPC .......... G03F 7/70633; G03F 7/706849; G03F 7/706851; G03F 7/00; G01B 11/14; G01B 11/24; G01B 11/25; G01B 11/27; G01B 9/02
See application file for complete search history.

(56) References Cited

U.S. PATENT DOCUMENTS

| | | | |
|---|---|---|---|
| 10,990,023 B1 | 4/2021 | Hsieh et al. | |
| 2019/0101835 A1 | 4/2019 | Chen | |
| 2022/0034652 A1 | 2/2022 | Manassen et al. | |
| 2023/0213875 A1* | 7/2023 | Lubashevsky | G03F 7/70633 356/496 |
| 2024/0280914 A1* | 8/2024 | Manassen | G03F 7/70633 |

FOREIGN PATENT DOCUMENTS

| | | |
|---|---|---|
| KR | 1020170048489 A | 5/2017 |
| WO | 2022020402 A1 | 1/2022 |

OTHER PUBLICATIONS

Korean Intellectual Property Office, International Search Report and Written Opinion received in International Application No. PCT/US2024/028265, Sep. 2, 2024, 9 pages.

* cited by examiner

*Primary Examiner* — Michelle M Iacoletti
*Assistant Examiner* — Clark David Hovis
(74) *Attorney, Agent, or Firm* — Suiter Swantz IP

(57) ABSTRACT

An overlay metrology system may include an illumination source to generate illumination including two or more spectral bands having two or more center wavelengths. The system may include an optical sub-system to illuminate and image a sample, where the sample in accordance with the metrology recipe includes one or more cells with grating-over-grating structures formed as overlapping gratings with different pitches in different sample layers. The system may include collection pupil components to exclusively pass, for each of the two or more center wavelengths, two diffraction lobes from each of the different pitches of the grating-over-grating structures. A controller may receive images of the sample from the detectors generated in accordance with the metrology recipe and generate overlay measurements between at least some of the different layers of the sample based on the images.

23 Claims, 10 Drawing Sheets

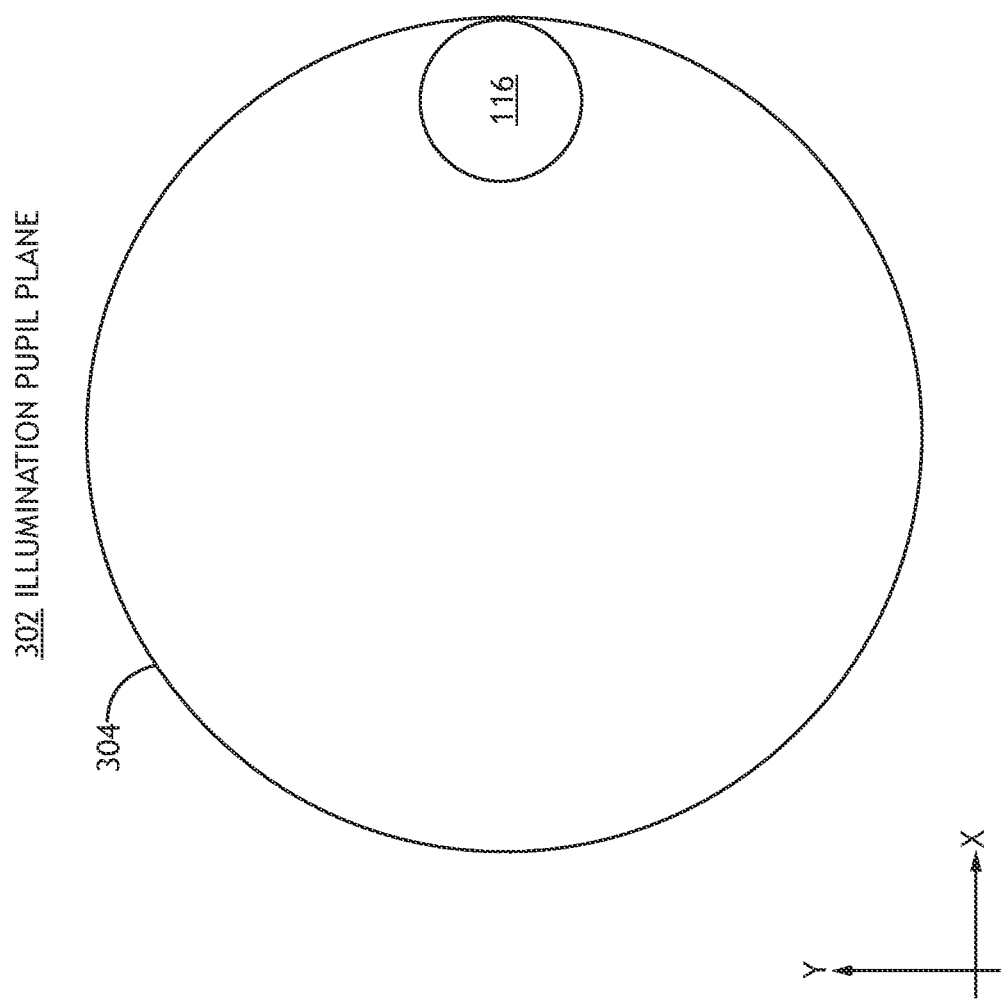

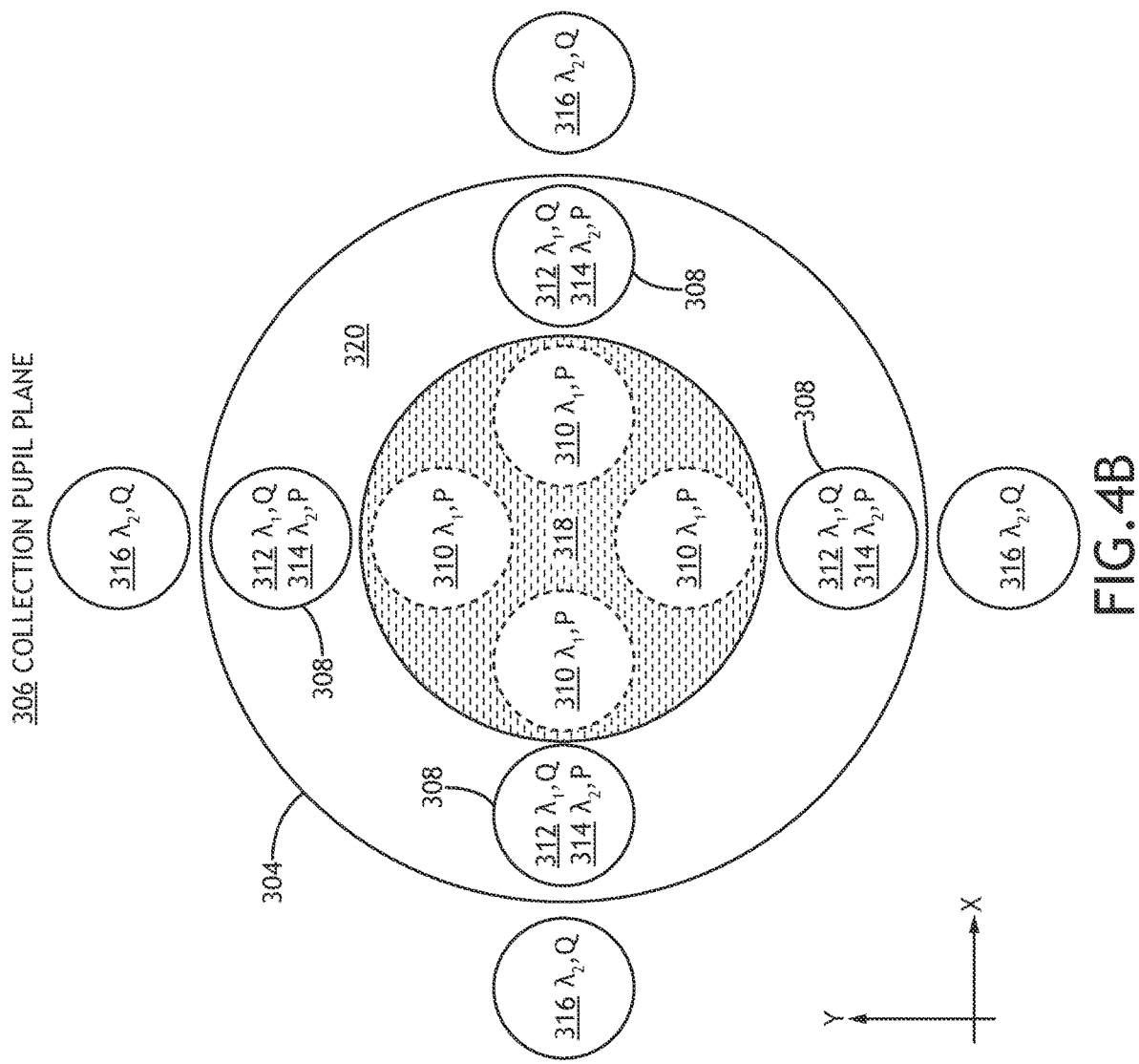

GRATING-OVER-GRATING OVERLAY MEASUREMENT WITH PARALLEL COLOR PER LAYER

TECHNICAL FIELD

The present disclosure relates generally to overlay metrology and, more particularly, to overlay metrology with parallel colors per layer.

BACKGROUND

Overlay metrology may measure relative registration between sample layers of a semiconductor device during fabrication. Demand for decreasing feature size places commensurate demands on overlay metrology. One approach to meeting this demand is to increase the number of overlay measurements performed during fabrication, which may enable higher-order model corrections. Specifically, correction-per-exposure (CPE) is increasingly used, which requires additional intra-field measurements and may require on-product (e.g., in-die) measurements. There is therefore a need to develop systems and methods to address the above deficiencies.

SUMMARY

An overlay metrology system is disclosed in accordance with one or more illustrative embodiments of the present disclosure. In one illustrative embodiment, the system includes one or more illumination sources configured to generate one or more illumination beams, each of the one or more illumination beams including two or more spectral bands having two or more center wavelengths. In another illustrative embodiment, the system includes an optical sub-system including one or more lenses and one or more detectors configured to illuminate a sample with the illumination and image the sample in response to the illumination when implementing a metrology recipe, where the sample in accordance with the metrology recipe includes one or more cells with grating-over-grating structures formed as overlapping gratings with different pitches in different sample layers. In another illustrative embodiment, the optical sub-system includes components in a collection pupil to exclusively pass, for each of the two or more center wavelengths, two diffraction lobes from each of the different pitches of the grating-over-grating structures. In another illustrative embodiment, the system includes a controller configured to receive one or more images of the sample from the one or more detectors generated in accordance with the metrology recipe and generate one or more overlay measurements between at least some of the different layers of the sample based on the one or more images.

An overlay metrology system is disclosed, in accordance with one or more illustrative embodiments of the present disclosure. In one illustrative embodiment, the system includes a controller. In another illustrative embodiment, the controller is configured to receive one or more images of a sample generated in accordance with the metrology recipe from one or more detectors of an optical sub-system, where the sample in accordance with the metrology recipe includes one or more cells with grating-over-grating structures formed as overlapping gratings with different pitches in different sample layers. In another illustrative embodiment, the one or more images are generated in accordance with the metrology recipe based on illumination from one or more illumination beams, each of the one or more illumination beams including two or more spectral bands having two or more center wavelengths. In another illustrative embodiment, the optical sub-system includes components in a collection pupil to exclusively pass, for each of the two or more center wavelengths, two diffraction lobes from each of the different pitches of the grating-over-grating structures. In another illustrative embodiment, the controller is configured to generate one or more overlay measurements between at least some of the different layers of the sample based on the one or more images.

A method is disclosed, in accordance with one or more illustrative embodiments of the present disclosure. In one illustrative embodiment, the method includes illuminating a sample with one or more illumination beams, each of the one or more illumination beams including two or more spectral bands having two or more center wavelengths. In another illustrative embodiment, the sample in accordance with the metrology recipe includes one or more cells with grating-over-grating structures formed as overlapping gratings with different pitches in different sample layers. In another illustrative embodiment, the method includes generating one or more images of the sample with an illumination sub-system including components in a collection pupil to exclusively pass, for each of the two or more center wavelengths, two diffraction lobes from each of the different pitches of the grating-over-grating structures. In another illustrative embodiment, the method includes generating one or more overlay measurements between at least some of the different layers of the sample based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 3A is a simplified top view of an illumination pupil plane of the optical sub-system depicting illumination as a single multi-wavelength illumination beam, in accordance with one or more embodiments of the present disclosure.

FIG. 4B is a simplified view of a collection pupil plane of the optical sub-system depicting collected sample light based on the illumination in FIG. 4A, in accordance with one or more embodiments of the present disclosure.

DETAILED DESCRIPTION

Figure 1A:
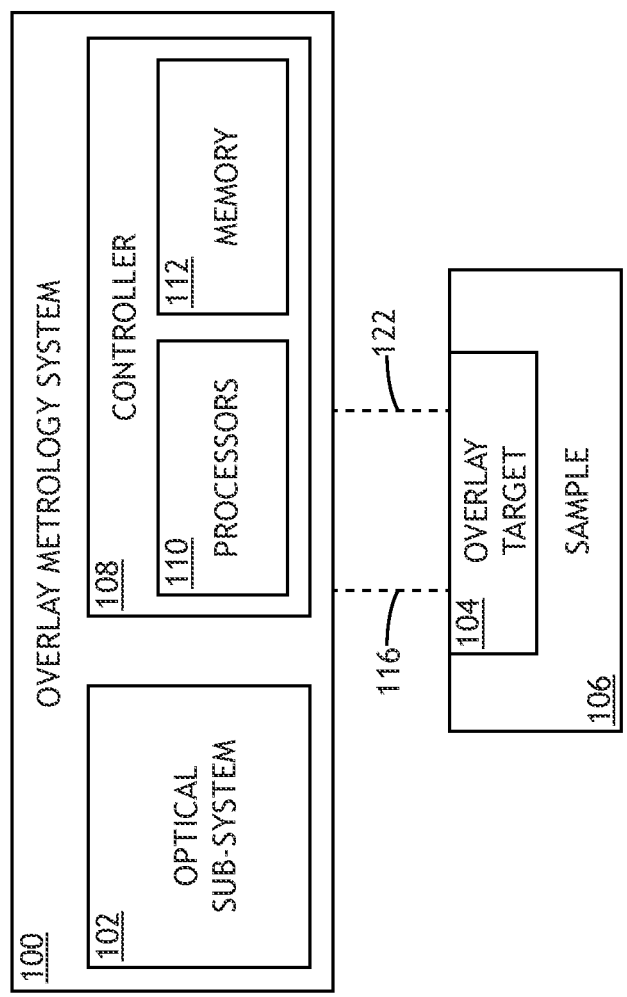
FIG. 1A is a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing an overlay measurement of an overlay target with a grating-over-grating (GoG) structure (e.g., a Moiré structure) with different pitches on different sample layers, where the overlay measurement is based on simultaneous or sequential illumination of the GoG structure with multiple wavelengths and collection of two diffraction lobes of a unique wavelength per sample layer. For example, an overlay metrology system may generate a single multi-color image of the overlay target or may generate separate images of the different sample layers with the different colors.

In some embodiments, the collection of two diffraction lobes of a unique wavelength (e.g., a unique center wavelength) per sample layer is achieved by illuminating the overlay target with an illumination beam including colinear light with multiple wavelengths (e.g., colinear light having distinct spectral ranges and center wavelengths) and utilizing a collection pupil aperture to select the two diffraction lobes with unique wavelengths per sample layer. For example, the collection pupil aperture may pass a zero-order diffraction lobe and a single first-order diffraction lobe of a unique color for each sample layer.

In some embodiments, the wavelengths and/or the pitches of the GoG structures are selected to provide that a first-order diffraction lobe of one wavelength from one sample layer overlaps with a first-order diffraction lobe of another wavelength from another sample layer. In this way, first-order illumination lobes with unique wavelengths from different sample layers may pass through a common aperture in the collection pupil. For example, an overlay metrology system may include an annular collection pupil aperture to selectively pass a zero-order diffraction lobe and a single first-order diffraction lobe with unique wavelengths for each sample layer.

Further, in some embodiments, the wavelengths and/or the pitches of the off-axis through-the-lens illumination may be arranged in a Littrow configuration with off-axis illumination at or near a maximum Numerical Aperture (NA) of an objective lens used for simultaneous illumination and collection. In this configuration, the collected first-order diffraction lobes may be separated from the zero-order diffraction lobes by the full NA of the objective lens. It is contemplated herein that such a configuration may maximize the NA of the objective lens and enable the measurements of GoG structures with relatively small pitches. As a result, the systems and methods disclosed herein may enable efficient overlay measurements of relatively small targets. For example, a traditional Advanced Imaging Metrology (AIM) target may include non-overlapping gratings in different sample layers and may typically include two opposing cells for each direction. In contrast, the systems and methods disclosed herein may enable accurate measurements of overlay targets with a single small cell per measurement direction. In particular, separate imaging of gratings belonging to different layers that are located one above the other eliminates potential OVL error (e.g., TIS error) associated with rotational asymmetries without the need for a multi-cell measurement and thus enables single-cell measurements per direction.

Referring now to FIGS. 1A-5, systems and methods for overlay metrology are described in greater detail, in accordance with one or more embodiments of the present disclosure.

FIG. 1A is a conceptual view illustrating an overlay metrology system 100, in accordance with one or more embodiments of the present disclosure. In one embodiment, the overlay metrology system 100 includes an optical sub-system 102 configured to generate at least one image of at least one overlay target 104 on a sample 106. For example, the optical sub-system 102 may generate one or more field-plane images of the overlay target 104 and/or one or more pupil-plane images of the overlay target 104.

The sample 106 may include any type of sample known in the art having an overlay target 104. For example, the sample 106 may include a substrate formed of a semiconductor or non-semiconductor material (e.g., a wafer, or the like) such as, but not limited to, monocrystalline silicon, gallium arsenide, and indium phosphide. A sample 106 may further include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample 106 may include a plurality of dies, each having repeatable patterned features. Formation and processing of such layers of material may ultimately result in completed devices. Many different types of devices may be formed on a sample 106, and the term sample as used herein is intended to encompass any material on which any type of device known in the art is being fabricated. Further, for the purposes of the present disclosure, the term sample and wafer should be interpreted as interchangeable.

The optical sub-system 102 may include any type of metrology tool known in the art suitable for generating one or more images of one or more overlay targets 104 at any plane or combination of planes (e.g., field and/or pupil planes). In this way, the optical sub-system 102 may be characterized as an imaging sub-system. For example, the optical sub-system 102 may include, but are not limited to, various lenses (transmissive or reflective), pupils, stops, or apodizers configured to generate an image of an object.

In another embodiment, the overlay metrology system 100 includes a controller 108 communicatively coupled to the optical sub-system 102 or any constituent components. In another embodiment, the controller 108 includes one or more processors 110 configured to execute program instructions maintained on a memory device 112, or memory. The one or more processors 110 of a controller 108 may include any processing element known in the art. In this sense, the one or more processors 110 may include any microprocessor-type device configured to execute algorithms and/or instructions. Further, the memory device 112 may include any storage medium known in the art suitable for storing program instructions executable by the associated one or more processors 110. For example, the memory device 112 may include a non-transitory memory medium. As an additional example, the memory device 112 may include, but is not limited to, a read-only memory (ROM), a random-access memory (RAM), a magnetic or optical memory device (e.g., disk), a magnetic tape, a solid-state drive and the like. It is further noted that memory device 112 may be housed in a common controller housing with the one or more processors 110.

In this regard, the one or more processors 110 of the controller 108 may execute any of the various process steps described throughout the present disclosure. For example, the one or more processors 110 of the controller 108 may receive one or more images of the overlay target 104 (e.g., one or more field-plane images or pupil-plane images) from a detector and generate one or more metrology measurements for the sample 106 based on the one or more images from the detector.

An overlay target 104 and/or an overlay metrology system 100 suitable for characterizing the overlay target 104 may be configured according to a metrology recipe suitable for generating overlay measurements based on a desired technique or algorithm (e.g., executed by the controller 108). More generally, an overlay metrology system 100 may be configurable according to a variety of metrology recipes to perform overlay measurements using a variety of techniques and/or perform overlay measurements on a variety of overlay targets 104 with different designs.

For example, a metrology recipe may include various aspects of an overlay target 104 or a design of an overlay target 104 including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

Figure 1B:
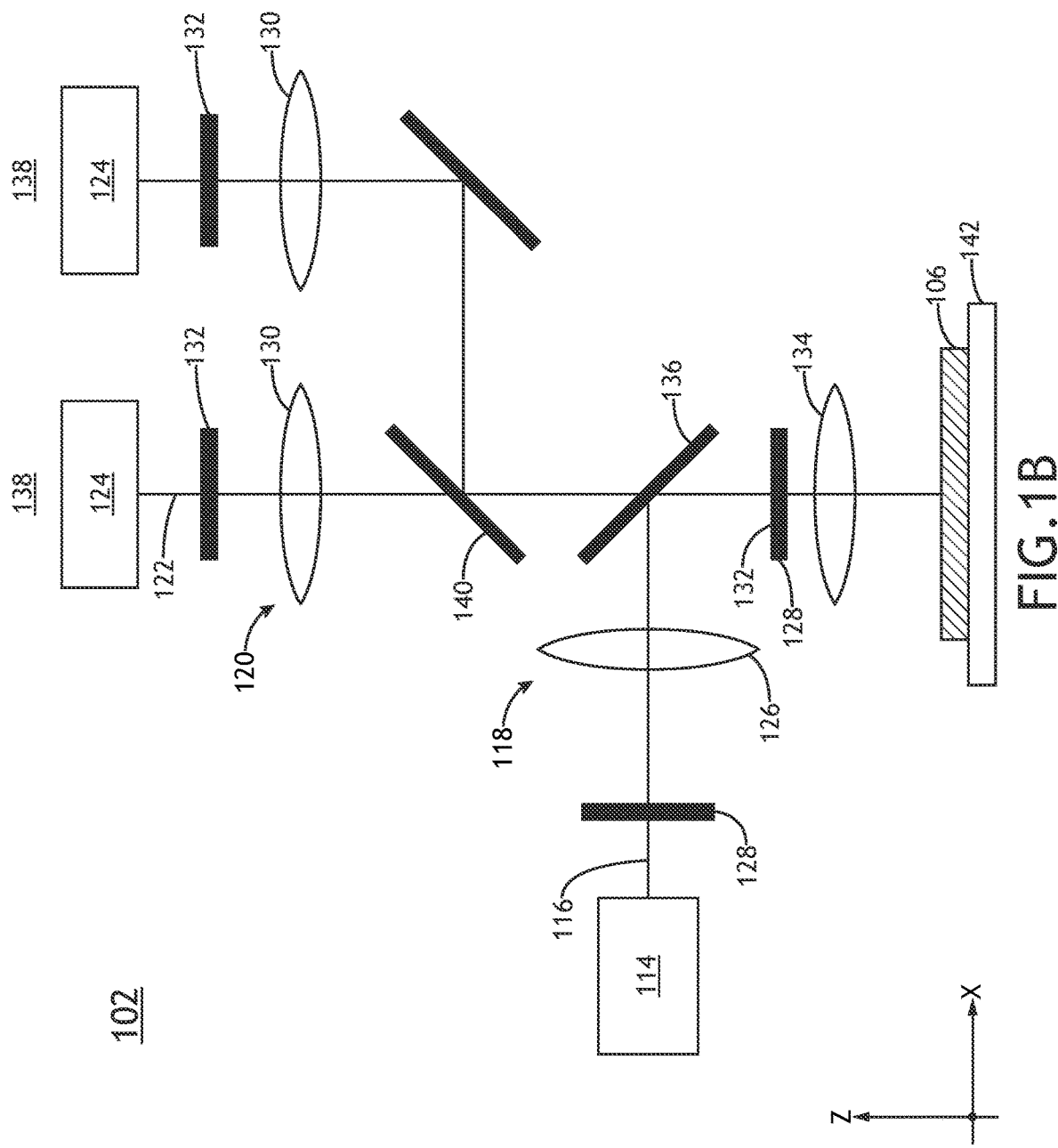
FIG. 1B is a conceptual view of an optical sub-system in accordance with one or more embodiments of the present disclosure.

FIG. 1B is a conceptual view of an optical sub-system 102 in accordance with one or more embodiments of the present disclosure.

In one embodiment, the optical sub-system 102 includes at least one illumination source 114 configured to generate multi-wavelength illumination 116. For example, the illumination 116 may include light characterized by a first center wavelength and/or first spectrum and light characterized by a second center wavelength and/or a second spectrum. In a general sense, the first and second spectra may have any bandwidths. For example, the first and second spectra may correspond to narrowband illumination with bandwidths on the order of nanometers or smaller. It is recognized herein that diffraction is wavelength-dependent such that diffracted illumination 116 (e.g., from an overlay target 104) may be spatially spread across a range of diffraction angles. Accordingly, the bandwidths of the first and second spectra may be selected based on application requirements or tolerances. For convenience, illumination 116 having first and second spectra may be referred to herein as light with first and second center wavelengths or more simply as light with first and second wavelengths.

Such multi-wavelength illumination 116 may be generated by a single illumination source 114 (e.g., as a single illumination beam) or multiple illumination sources 114 (e.g., as multiple illumination beams. Further, in some embodiments, the first and/or second spectra associated with first and second center wavelengths of the illumination 116 are directly generated by the one or more illumination sources 114. In some embodiments, the first and/or second spectra associated with first and second center wavelengths of the illumination 116 are directly generated by spectrally filtering light generated by the one or more illumination sources 114.

An illumination source 114 may include any type of light source known in the art. In one embodiment, the illumination source 114 includes one or more coherent sources such as, but not limited to, one or more laser sources. In this regard, the illumination source 114 may produce an illumination 116 having high coherence (e.g., high spatial coherence and/or temporal coherence). For example, the illumination source 114 may include one or more broadband lasers such as, but not limited to, one or more supercontinuum lasers or white-light lasers. By way of another example, the illumination source 114 may include one or more narrowband lasers. By way of a further example, the illumination source 114 may include one or more tunable lasers to provide an illumination 116 having tunable spectral intensity. Further, a coherent illumination source 114 may be based on any type of technology or product design. For example, the illumination source 114 may include, but are not limited to, any combination of one or more fiber lasers, one or more diode lasers, or one or more gas lasers.

In another embodiment, the illumination source 114 includes one or more low-coherence sources to provide an illumination 116 having low or partial coherence (e.g., spatial and/or temporal coherence). For example, the illumination source 114 may include one or more light emitting diodes (LEDs) or superluminescence LEDs. By way of another example, the illumination source 114 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 114 may include a lamp source such as, but not limited to, an arc lamp, a discharge lamp, an electrode-less lamp, or the like.

Further, the illumination source 114 may include any combination of light sources. In one embodiment, the illumination source 114 includes one or more supercontinuum laser sources to provide broadband illumination and one or more partially-coherent high-brightness LEDs to supplement gaps in the spectrum of the one or more supercontinuum laser sources.

The illumination source 114 may further provide light having any selected temporal characteristics. In one embodiment, the illumination source 114 includes one or more continuous-wave sources to provide a continuous-wave illumination 116. In another embodiment, the illumination source 114 includes one or more pulsed sources to provide a pulsed or otherwise modulated illumination 116. For example, the illumination source 114 may include one or more mode-locked lasers, one or more Q-switched lasers, or the like.

In some embodiments, the overlay metrology system 100 includes an illumination pathway 118 (e.g., an illumination sub-system) including one or more components to direct the illumination 116 to the sample 106. In some embodiments, the optical sub-system 102 includes a collection pathway 120 including one or more components to collect light from the sample, referred to herein as sample light 122. The sample light 122 may include any type of radiation emanating from the sample 106 including, but not limited to, light or particles. For example, the sample light 122 may include portions of the illumination 116 diffracted, reflected and/or scattered by the sample 106. By way of another example, the sample light 122 may include luminescence induced by absorption of the illumination 116 by the sample 106. By way of another example, the sample light 122 may include particles from the sample 106 in response to the illumination 116 such as, but not limited to, backscattered electrons or secondary electrons. In another embodiment, the optical sub-system 102 includes at least one detector 124 configured to capture at least a portion of the sample light 122 from the collection pathway 120.

In one embodiment, the illumination pathway 118 includes one or more illumination lenses 126 to direct the illumination 116 from the illumination source 114 to the sample 106. Additionally, the illumination lenses 126 may be arranged to relay one or more field planes or pupil planes to locations within the illumination pathway 118. The illumination pathway 118 may further include one or more illumination conditioning components 128 suitable for modifying and/or conditioning the illumination 116. The illumination conditioning components 128 may be, but are not required to be, located at field planes and/or pupil planes in the illumination pathway 118. For example, the one or more illumination conditioning components 128 may include, but are not limited to, an illumination aperture stop, an illumination field stop, one or more polarizers, one or more compensators, one or more filters, one or more beamsplitters, one or more diffusers, one or more homogenizers, one or more apodizers, one or more beam shapers, one or more mirrors, or one or more lenses. Any such components may be located at any suitable location or combination of locations such as, but not limited to, illumination field planes (e.g., planes conjugate to the sample 106) or illumination pupil planes (e.g., diffraction planes, Fourier planes, or the like).

In one embodiment, the collection pathway 120 includes one or more collection lenses 130 to direct the sample light 122 from the sample 106 to the detector 124. In another embodiment, the collection pathway 120 includes one or more collection conditioning components 132 suitable for modifying and/or conditioning the sample light 122. For example, the one or more collection conditioning components 132 may include, but are not limited to, one or more polarizers, one or more filters, one or more beamsplitters, one or more diffusers, one or more apodizers, or one or more beam shapers. Any such components may be located at any suitable location or combination of locations such as, but not limited to, collection field planes or collection pupil planes.

In one embodiment, the optical sub-system 102 includes an objective lens 134 to direct illumination 116 to the sample 106 and/or capture the sample light 122 from the sample 106. For example, as illustrated in FIG. 1B, the optical sub-system 102 may include a beamsplitter 136 common to both the illumination pathway 118 and the collection pathway 120 to allow the objective lens 134 to simultaneously direct illumination 116 to the sample 106 and capture the sample light 122 from the sample 106. The optical sub-system 102 may further include one or more additional components common to both the illumination pathway 118 and the collection pathway 120. For example, FIG. 1B depicts a component near the objective lens 134 that may operate as both an illumination conditioning component 128 and a collection condition component 132. As an illustration, such a component may be located at a pupil plane common to the illumination pathway 118 and the collection pathway 120 and may thus control both the distribution of illumination 116 directed to the sample 106 and sample light 122 used for a measurement.

In another embodiment, though not shown, the illumination pathway 118 and the collection pathway 120 may include separate lenses to direct the illumination 116 to the sample 106 and collect the sample light 122, respectively.

The detector 124 may include any optical detector known in the art suitable for capturing sample light 122 received from the sample 106. Further, the detector 124 may be suitable for capturing images of a sample 106 that is either stationary or moving. For example, a detector 124 may include, but is not limited to, a photodiode array (PDA), a charge-coupled device (CCD), a complementary metal-oxide semiconductor (CMOS) device, a time-delay integration (TDI) detector, a line-scan detector, a photomultiplier tube (PMT), an avalanche photodiode (APD), or the like. In another embodiment, a detector 124 may include a spectroscopic detector suitable for identifying wavelengths of radiation emanating from the sample 106 and dispersed onto a sensor using a dispersive element. In some embodiments, the optical sub-system 102 includes multiple detectors 124.

A detector 124 may further be located at any imaging plane of the overlay metrology system 100. For instance, a detector 124 may be located at a plane conjugate to the sample 106 to generate an image of the sample 106. In another instance, a detector 124 may be located at a pupil plane (or a conjugate thereof) to generate a pupil image.

In some embodiments, the optical sub-system 102 includes multiple collection channels 138, which may enable the generation of multiple images of an overlay target 104 under different conditions (e.g., different illumination conditions, different collection conditions, and/or images at different planes). As an illustration, FIG. 1B depicts an optical sub-system 102 having two collection channels 138, each with a separate detector 124. In this configuration, the optical sub-system 102 includes one or more channel beamsplitters 140 to split light into the different collection channels 138. For example, the channel beamsplitters 140 may include, but are not limited to, spectral beamsplitters (e.g., dichroic beamsplitters) to split the sample light 122 based on spectral content or polarizing beamsplitters to split the sample light 122 based on polarization. Additionally, the collection channels 138 may have different collection conditioning components 132 (e.g., filters, apertures, stops, or the like) to provide independent control of the sample light 122.

In one embodiment, the optical sub-system 102 includes a sample positioning sub-system 142 configured to adjust the sample 106 and/or the illumination 116 prior, during, and/or after a measurement. For example, FIG. 1B illustrates a sample positioning sub-system 142 as a translation stage to adjust the position of the sample 106 along any dimension such as, but not limited to, a lateral position within the X-Y plane, axially along the Z axis (e.g., an optical axis of the objective lens 134), tip, tilt, or the like. By way of another example, though not shown, the sample positioning sub-system 142 may include one or more scanning optical elements (e.g., galvanometers, rotatable mirrors, or the like) suitable for scanning the illumination 116 across the sample 106, or a portion thereof.

Although not explicitly shown, the components of the optical sub-system 102 may be distributed in any fixed or moveable (e.g., translatable) arrangement. As an illustration, the optical sub-system 102 may include one or more components located on an optical head that may be positioned proximate to a sample and may be moveable in whole or part (e.g., the position of the optical head may be adjusted relative to a sample 106). Further, the optical sub-system 102 may include one or more components in a fixed location that may be connected to the optical head through an optical fiber or free-space optical components.

Referring now to FIGS. 2A-2D, overlay metrology of overlay targets 104 with GoG structures 204 based on per-layer wavelength imaging is described in greater detail, in accordance with one or more embodiments of the present disclosure.

Figure 2A:
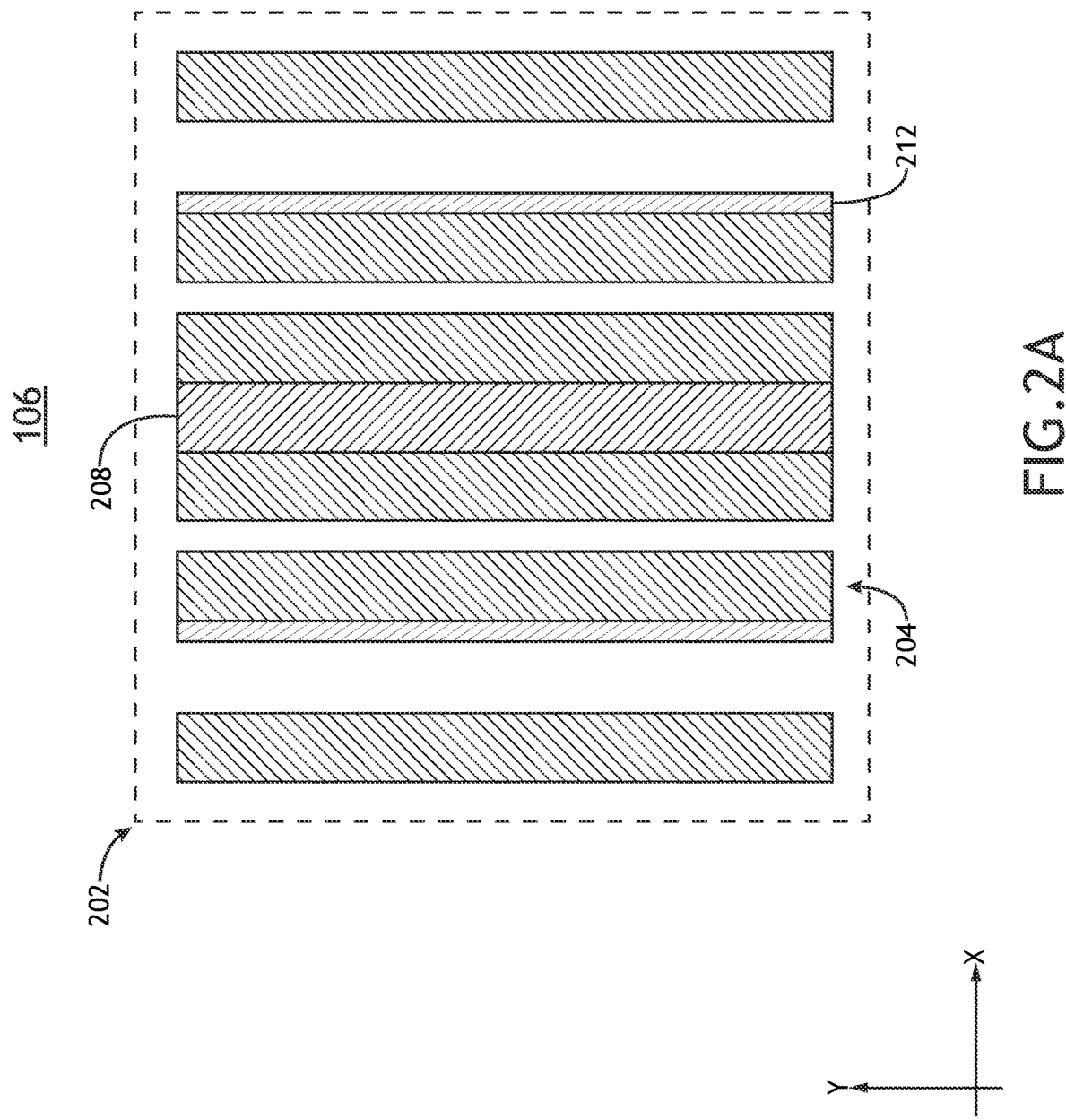
FIG. 2A is a top view of a cell of an overlay target with a grating-over-grating (GoG) structure, in accordance with one or more embodiments of the present disclosure.
Figure 2B:
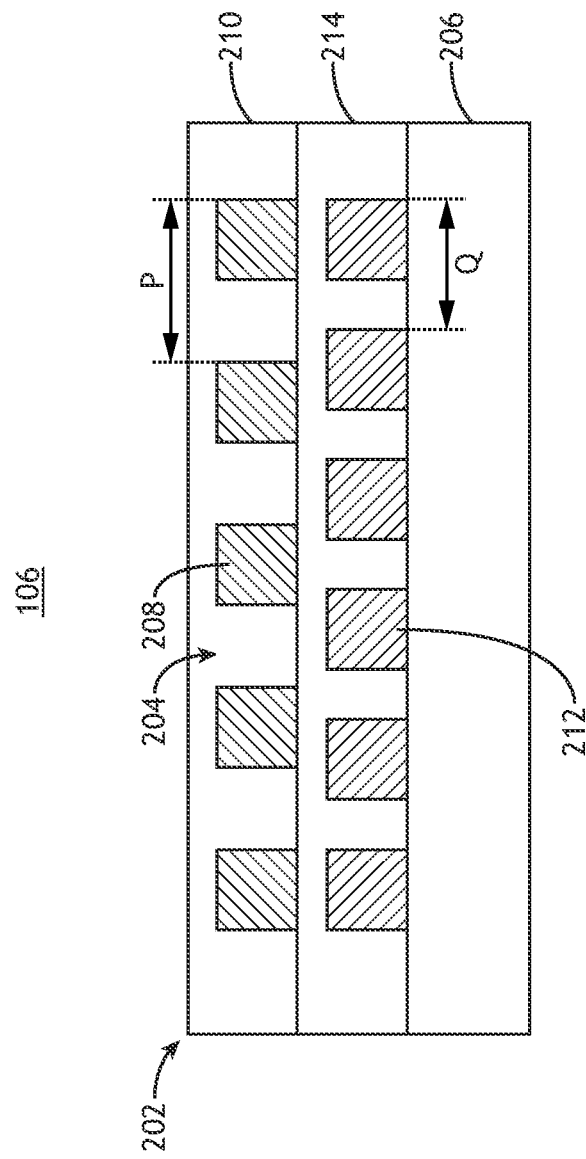
FIG. 2B is a side view of a single cell of the overlay target in FIG. 2A on a substrate, in accordance with one or more embodiments of the present disclosure.

FIG. 2A is a top view of a cell 202 of an overlay target 104 with a GoG structure 204 (e.g., Moiré structure), in accordance with one or more embodiments of the present disclosure. FIG. 2B is a side view of a single cell 202 of the overlay target 104 in FIG. 2A on a substrate 206, in accordance with one or more embodiments of the present disclosure. In some embodiments, the GoG structure 204 includes a first-layer grating 208 (e.g., a top grating) located on a first layer 210 of the sample 106 and a second-layer grating 212 (e.g., a bottom grating) located on a second layer 214 of the sample 106 oriented such that the regions including the first-layer grating 208 and the second-layer grating 212 overlap. However, this is merely illustrative. In some embodiments, the regions including the first-layer grating 208 and the second-layer grating 212 do not overlap, which may be referred to a side-by-side configuration. Further, the first-layer grating 208 and the second-layer grating 212 have different pitches. For example, FIG. 2B illustrates the pitches of the first-layer grating 208 and the second-layer grating 212 as P and Q, respectively.

An overlay target 104 may generally be formed from any number of cells 202 and any particular cell 202 may include a GoG structure 204 with a periodicity along any direction.

Figure 2D:
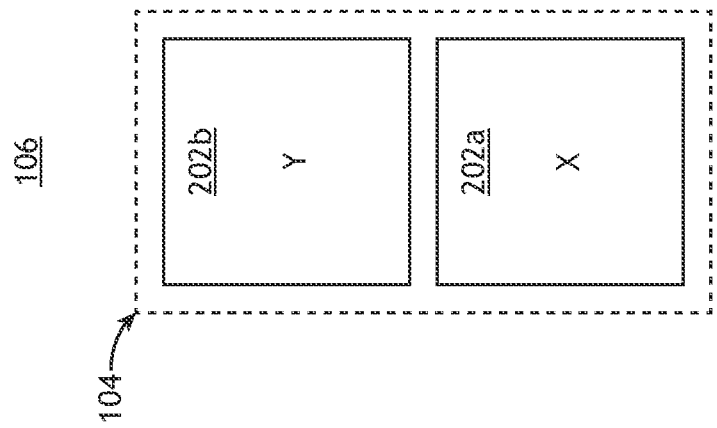
FIG. 2D is a simplified top view of an overlay target having a single cell having periodicity along an X direction and a single cell having periodicity along a Y direction, in accordance with one or more embodiments of the present disclosure.
Figure 2C:
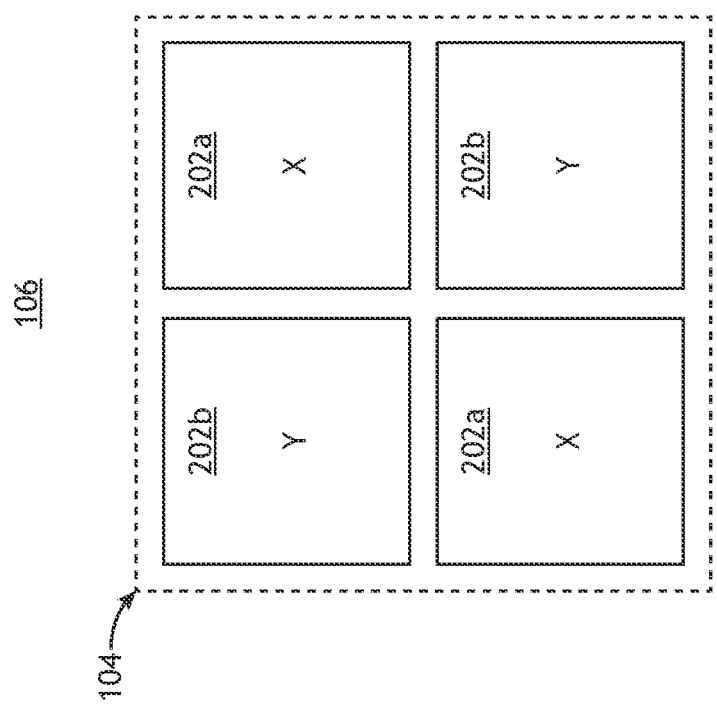
FIG. 2C is a simplified top view of an overlay target having two cells having periodicities along an X direction and two cells having periodicities along a Y direction, in accordance with one or more embodiments of the present disclosure.

In some embodiments, an overlay target 104 includes two or more cells 202 with GoG structures 204 with periodicities along at least one measurement direction. FIG. 2C is a simplified top view of an overlay target 104 having two cells 202a having periodicities along an X direction (e.g., a first measurement direction) and two cells 202b having periodicities along a Y direction (e.g., a second measurement direction), in accordance with one or more embodiments of the present disclosure.

Further, various configurations of the design illustrated in FIG. 2C are possible.

In some embodiments, the cells 202 having periodicity along a particular direction have different designs. For example, one of the cells 202a (and/or cells 202b) may include a first-layer grating 208 with a pitch P and a second-layer grating 212 with a pitch Q, whereas the other of the cells 202a (and/or cells 202b) may include a first-layer grating 208 with the pitch Q and a second-layer grating 212 with the pitch P. In some embodiments, the cells 202 having periodicity along a particular direction have a common design. For example, both of the cells 202a (and/or cells 202b) may include a first-layer grating 208 with a pitch P and a second-layer grating 212 with a pitch Q.

It is recognized herein that multi-cell measurements along a particular measurement direction may be useful for various purposes such as, but not limited to, correcting or avoiding errors associated with target rotation, self-referencing, self-calibration, or the like. However, it is contemplated herein that imaging each of the sample layers (e.g., the first-layer grating 208 and the second-layer grating 212 in an overlapping region) with different wavelengths as disclosed herein may eliminate the need for multi-cell measurements along a particular measurement direction (e.g., to correct for target rotation errors). As a result, accurate overlay measurements may be performed based on measurements of a single cell 202 per direction. Such a configuration may promote a small overlay target 104, which may be particularly beneficial for, but not limited to, placement within a die (e.g., a process region). FIG. 2D is a simplified top view of an overlay target 104 having a single cell 202a having periodicity along an X direction (e.g., a first measurement direction) and a single cell 202b having periodicity along a Y direction (e.g., a second measurement direction), in accordance with one or more embodiments of the present disclosure.

FIGS. 3A-4B depict illumination and collection conditions suitable for imaging GoG structures 204 with per-layer wavelengths, in accordance with one or more embodiments of the present disclosure. It is noted that although FIGS. 3A-4B depict illumination and pupil planes separately, the optical sub-system 102 may include one or more pupil planes common to both the illumination pathway 118 and the collection pathway 120 (e.g., as illustrated in FIG. 1B).

In some embodiments, the optical sub-system 102 illuminates a GoG structures 204 (e.g., within a cell 202 of an overlay target 104) with illumination 116 having two or more center wavelengths (e.g., two or more spectra with different center wavelengths). As described previously herein, this multi-wavelength illumination 116 may be in the form of a single illumination beam or multiple illumination beams (e.g., different illumination beams for each wavelength). In the case of multiple illumination beams, the different illumination beams may generally be incident on the GoG structure 204 with a common incidence angle (e.g., be collinear) or may be incident on the GoG structure 204 with different incidence angles. Further, the different wavelengths may be incident on the GoG structure 204 simultaneously (e.g., for the simultaneous imaging) or sequentially (e.g., for sequential imaging).

The illumination 116 may be incident on sample 106 at any incidence angle or distribution thereof. For example, the illumination 116 may have a normal incident angle (e.g., normal to the optical axis of the objective lens 134 and/or the sample 106) or at an oblique incidence angle.

Figure 3B:
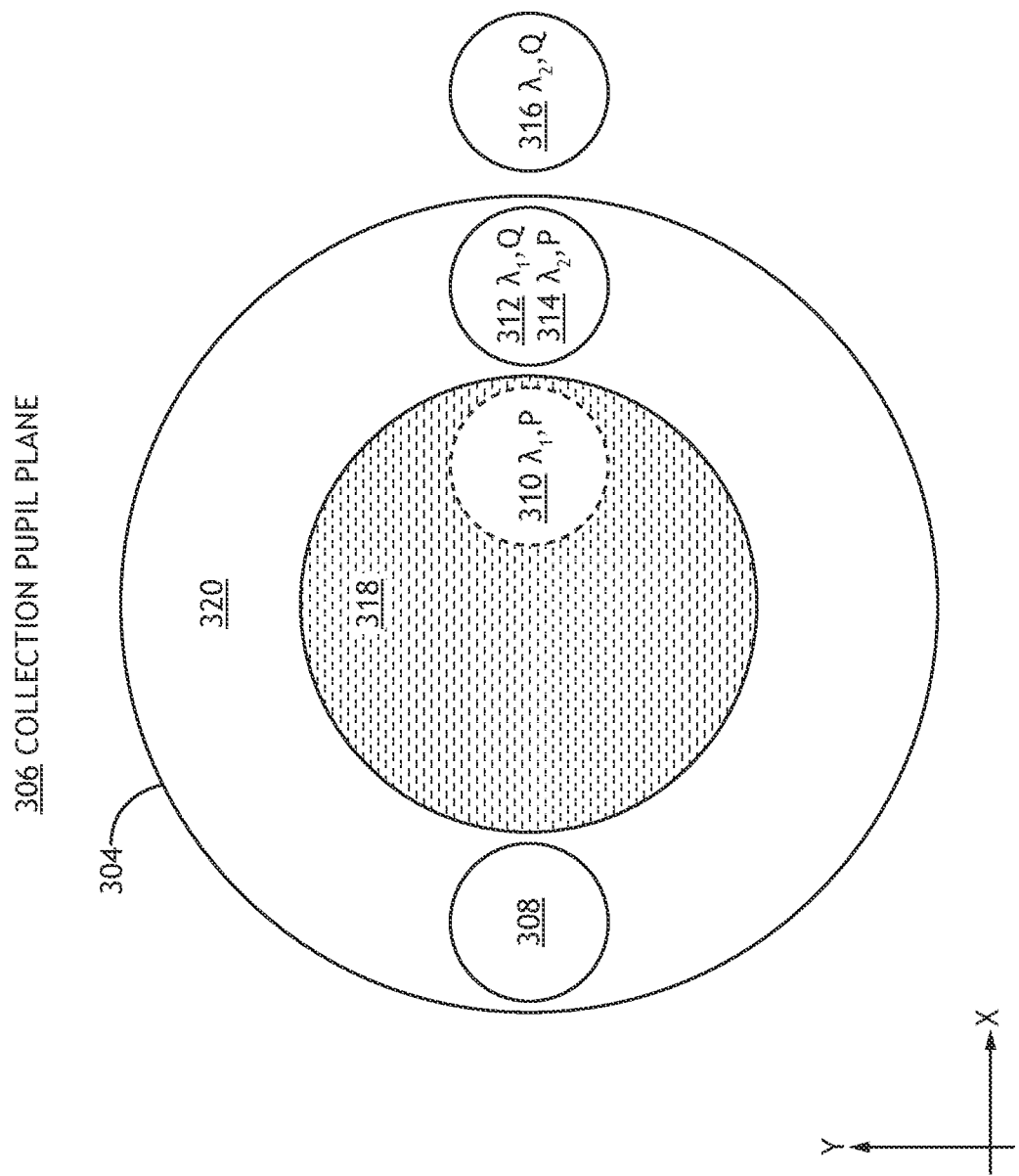
FIG. 3B is a simplified view of a collection pupil plane of the optical sub-system depicting collected sample light based on the illumination in FIG. 3A, in accordance with one or more embodiments of the present disclosure.

FIG. 3A is a simplified top view of an illumination pupil plane 302 of the optical sub-system 102 depicting illumination 116 as a single multi-wavelength illumination beam, in accordance with one or more embodiments of the present disclosure. In particular, FIG. 3A depicts the illumination 116 at an oblique incidence angle near the outer boundary 304 of the illumination pupil plane 302, which may fully utilize the numerical aperture (NA) of the objective lens 134 to capture diffraction orders as shown in FIG. 3B.

The illumination 116 in FIG. 3A may be characterized by a first spectrum centered around a first center wavelength and a second spectrum centered around a second center wavelength. In a general sense, the first and second center wavelengths may have any values. As one non-limiting example, the first and second center wavelengths may be 400 nm and 700 nm, respectively. For the purposes of illustration, the first and second center wavelengths are shown as $\lambda_1$ and $\lambda_2$, respectively.

FIG. 3B is a simplified view of a collection pupil plane 306 of the optical sub-system 102 depicting collected sample light 122 based on the illumination in FIG. 3A, in accordance with one or more embodiments of the present disclosure. As depicted in FIG. 3B, illuminating a GoG structure 204 with different pitches on different layers with multi-wavelength illumination 116 may generate multiple diffraction orders per layer. FIG. 3B illustrates a zero-order diffraction lobe 308 associated with all wavelengths and sample layers. Since zero-order diffraction is independent of both illumination wavelength and pitch, the zero-order diffraction of both the first and second center wavelengths from both the first-layer grating 208 and the second-layer grating 212 overlap in the collection pupil plane 306. FIG. 3B further illustrates a first-order diffraction lobe 310 from pitch P (e.g., from one of the first-layer grating 208 or the second-layer grating 212) and a first-order diffraction lobe 312 from pitch Q (e.g., from the other of the first-layer grating 208 or the second-layer grating 212), both associated with illumination 116 with wavelength $\lambda_1$. Finally, FIG. 3B illustrates a first-order diffraction lobe 314 from pitch P and a first-order diffraction lobe 316 from pitch Q, both associated with illumination 116 with wavelength $\lambda_2$. Notably, the pitches P and Q provide different distributions of diffraction orders for both wavelengths.

In some embodiments, the optical sub-system 102, the illumination 116, and/or the GoG structures 204 are configured (e.g., in a metrology recipe) to exclusively pass to a detector 124, for each of the two or more center wavelengths, two diffraction orders from each of the different pitches of the GoG structures 204 in an overlay target 104. In this way, each of the constituent grating structures (e.g., the first-layer grating 208 and the second-layer grating 212) may be imaged as sinusoids to provide high contrast for overlay determination based on the relative positions or phases of the imaged sinusoids. For example, it is well-known that the diffraction angle of light on a grating may be related to the ratio of the wavelength of the light ($\lambda$) to the pitch (p) of the grating ($\lambda$/p). In this way, the center wavelengths of the illumination 116 as well as the pitches of the GoG structures 204 (e.g., P and Q depicted in FIG. 2A) may be co-selected (e.g., in a metrology recipe) such that at least two diffraction orders for each center wavelength and for each constituent grating structure are collected within the NA of the selected objective lens 134.

In some embodiments, the optical sub-system 102 includes one or more components in a collection pupil plane 306 to exclusively pass, for each of the two or more center wavelengths, two diffraction lobes from each of the different pitches of the grating-over-grating structures. Such components in the collection pupil plane 306 may correspond to the collection conditioning components 132 and may include, but are not limited to, apertures or stops. For example, such components in the collection pupil plane 306 may block unwanted or extraneous diffraction orders that are collected by the objective lens 134. It is contemplated herein that such components may be located in any suitable collection pupil plane 306 such as, but not limited to, a collection pupil plane 306 in one of the collection channels 138, a collection pupil plane 306 shared by multiple collection channels 138, or a collection pupil plane 306 shared by both the collection pathway 120 and the illumination pathway 118 (e.g., as illustrated in FIG. 1B).

As an illustration, FIG. 3B depicts a central obscuration 318 in the collection pupil plane 306, which provides an annular aperture 320 between the central obscuration 318 and an outer boundary 322 of the collection pupil plane 306 (e.g., as defined by the objective lens 134 or another component). In this configuration, the zero-order diffraction lobe 308 for all wavelengths and constituent grating structures may pass through the aperture 320. Further, the $\lambda$/p ratios of the center wavelengths of the illumination 116 and the GoG structures 204 may be selected to provide that a single first-order diffraction lobe from each sample layer passes through the aperture 320. In FIG. 3B, the first-order diffraction lobe 312 with $\lambda_1$ from pitch Q and the first-order diffraction lobe 314 with $\lambda_2$ from pitch P are passed by the aperture 320. The first-order diffraction lobe 310 with $\lambda_1$ from pitch P is blocked by the central obscuration 318 and the first-order diffraction lobe 316 with $\lambda_2$ from pitch Q is outside the boundary 322 of the collection pupil plane 306. The exact values of relevant parameters such as, but not limited to, $\lambda_1$, $\lambda_2$, P, Q, the NA of the collection pupil plane 306, and/or the size of the central obscuration 318 may be selected as part of a metrology recipe for a particular overlay target 104 or cell 202 thereof. Further the exact values of such parameters may vary between different cells 202 and/or overlay targets 104 across a sample 106 to enable flexible sampling configurations.

In FIG. 3B, the $\lambda$/p ratios are selected to provide that the first-order diffraction lobe 312 with $\lambda_1$ from pitch Q and the first-order diffraction lobe 314 with $\lambda_2$ from pitch P overlap and further satisfy the Littrow condition and return along the path of the incident illumination 116, though this is merely an illustration and not a requirement. When this incidence angle is near the outer boundary 304 of the illumination pupil plane 302 as shown in FIG. 3A, this configuration may fully utilize the NA of the objective lens 134. Further, reduction of the pitches of the GoG structures 204 (e.g., P and Q) along with appropriate selection of the center wavelengths of the illumination 116 to maintain the required $\lambda$/p ratios may beneficially enable the utilization of small overlay targets 104 with a single cell 202 per measurement direction (e.g., as illustrated in FIG. 2D), which may be particularly beneficial when the overlay targets 104 are placed within the process regions of the dies on the sample 106. For instance, the systems and methods disclosed herein may enable the use of overlay targets 104 smaller than approximately 100 $\mu m^2$, which is in compliance with current and projected guidelines for on-die fabrication. However, this is not a limitation and merely an illustration of the space-saving capabilities.

Various numbers of images may be generated based on the configuration depicted in FIG. 3B. In some embodiments, the optical sub-system 102 includes a single detector 124 in a single collection channel 138 to generate a single image of the overlay target 104 (or cell 202 thereof) based on the diffraction lobes passed by the aperture 320. In this configuration, the single image may include all constituent grating structures of a GoG structure 204, where different layers of the GoG structure 204 are imaged with different center wavelengths. In some embodiments, the optical sub-system 102 includes multiple detectors 124 in multiple collection channels 138 to generate multiple of the overlay target 104 (or cell 202 thereof) based on different combinations of the diffraction lobes passed by the aperture 320. In this configuration, each collection channel 138 may generate a separate image of a single layer of a GoG structure 204 based on a single center wavelength. For example, the optical sub-system 102 may include one or more channel beamsplitters 140 to separate the center wavelengths (and their associated spectral ranges) to different collection channels 138.

Figure 4A:
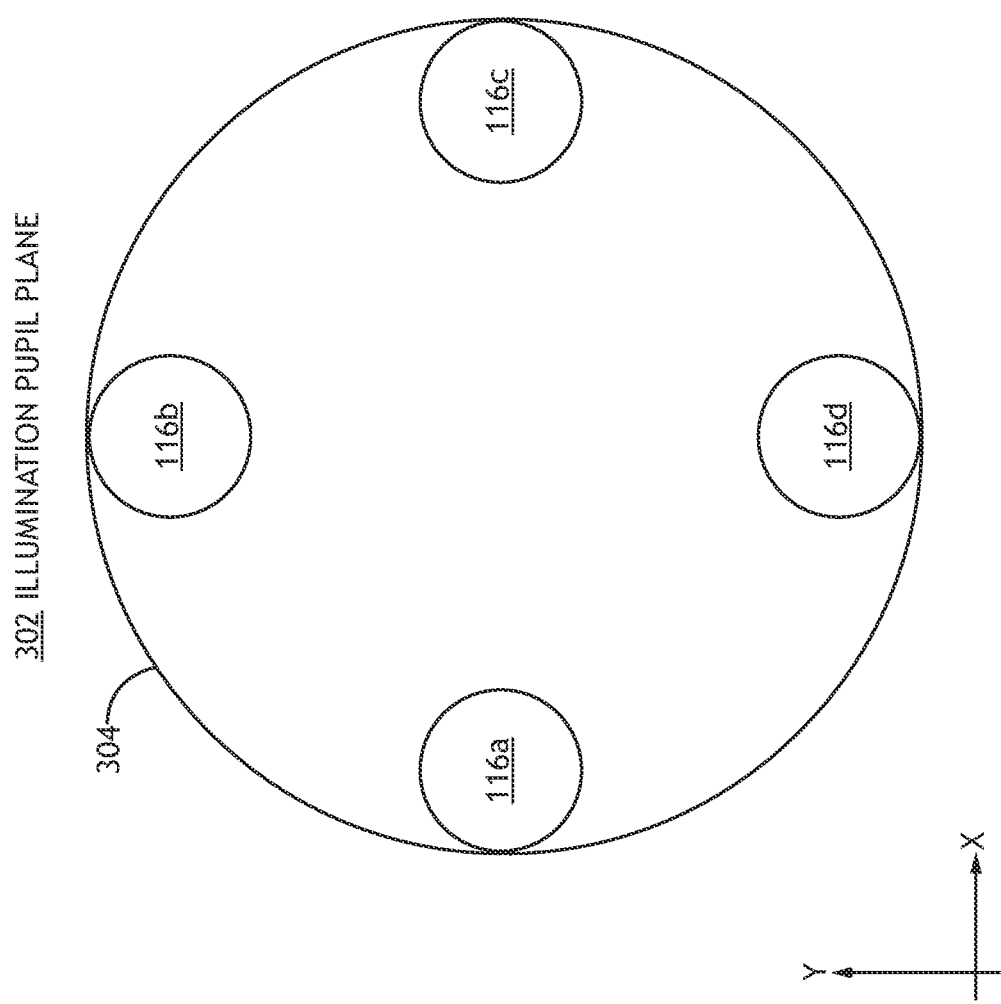
FIG. 4A is a simplified top view of an illumination pupil plane of the optical sub-system depicting multi-wavelength quadrupole illumination, in accordance with one or more embodiments of the present disclosure.

FIGS. 4A-4B further depict an extension of the concepts illustrated in FIGS. 3A-3B to illumination from multiple directions. FIG. 4A is a simplified top view of an illumination pupil plane 302 of the optical sub-system 102 depicting multi-wavelength quadrupole illumination 116, in accordance with one or more embodiments of the present disclosure. FIG. 4B is a simplified view of a collection pupil plane 306 of the optical sub-system 102 depicting collected sample light 122 based on the illumination in FIG. 4A, in accordance with one or more embodiments of the present disclosure.

In FIGS. 4A and 4B, the illumination and collection patterns are replicated four times in the different quadrants. In this way, only two selected diffraction orders (e.g., a zero-order diffraction lobe and a first-order diffraction lobe) are collected for each of the four beams of illumination 116a-d. It is contemplated that the four beams of illumination 116a-d may be directed to the sample 106 simultaneously, sequentially, or in any combination. Associated images may then be generated and used to determine overlay (e.g., by the controller 108) in accordance with a metrology recipe. In some embodiments, all four beams of illumination 116a-d are directed to an overlay target 104 (or a cell 202 thereof) simultaneously for the generation of a single image (or single set of images if multiple collection channels 138 are used), which may facilitate high measurement throughput. In some embodiments, two one beam of illumination 116 per direction is directed to an overlay target 104 (or a cell 202 thereof) at a time. For example, beams of illumination 116a,c may be directed to the overlay target 104 for the generation of a first image (or first set of images if multiple collection channels 138 are used), followed by beams of illumination 116b,d for a second image (or first set of images if multiple collection channels 138 are used)

It is to be understood that FIGS. 3A-4B are provided solely for illustrative purposes and should not be interpreted as limiting. For example, the optical sub-system 102 may include any type of components in the collection pupil plane 306 to exclusively pass desired diffraction lobes such that the depiction of a central obscuration 318 is illustrative rather than limiting. In some embodiments, the optical sub-system 102 includes multiple apertures distributed in the collection pupil plane 306 to selectively pass desired diffraction orders. As another example, any two diffraction orders from each constituent grating of a GoG structure 204 at a particular center wavelength may be selectively passed to a detector 124 for imaging. In this way, the use of zero-order and first-order diffraction lobes in FIGS. 3A-4B are merely illustrative and not limiting. Additionally, the concepts illustrated in FIGS. 3A-4B may be extended to overlay targets 104 including grating structures on three or more layers of the sample 106, each with a different period. In such a configuration, the illumination 116 may include a corresponding number of different center wavelengths (and associated bandwidths), where the λ/p ratios may be selected as disclosed to pass only two diffraction orders from each sample layer and for each center wavelength. Further, the illumination 116 may have any distribution suitable for measurements along one or more measurement directions. For example, the illumination 116 may have a dipole distribution along either the X or Y axes (e.g., the beams of illumination 116a,c or beams of illumination 116b,d, respectively).

Figure 5:
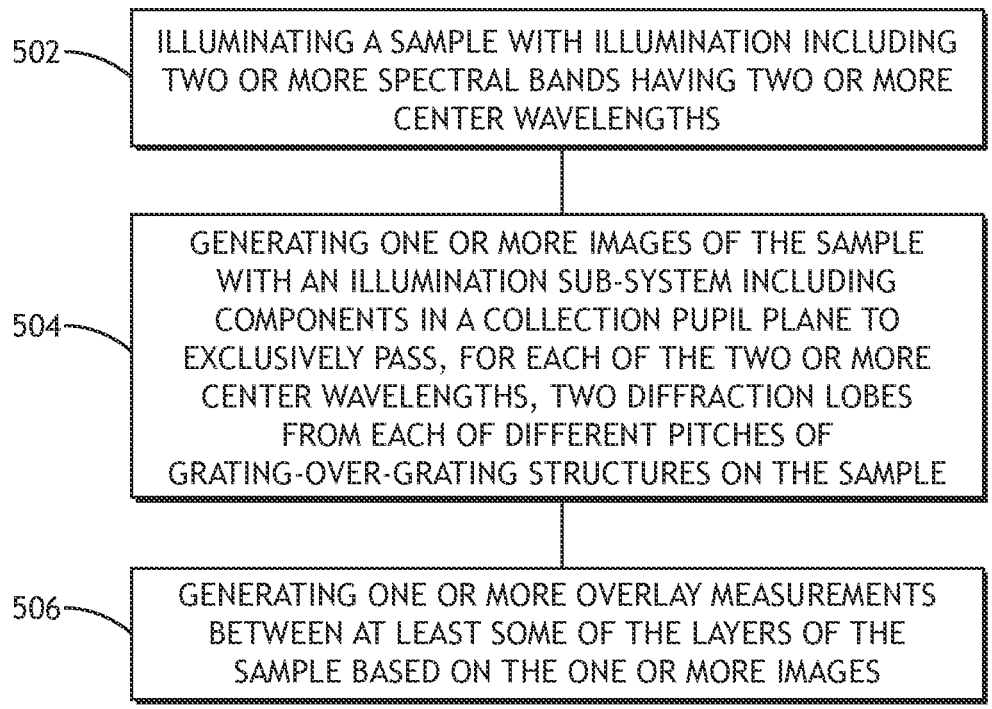
FIG. 5 is a flow diagram illustrating steps performed in an overlay method, in accordance with one or more embodiments of the present disclosure.

Referring now to FIG. 5, FIG. 5 is a flow diagram illustrating steps performed in an overlay method 500, in accordance with one or more embodiments of the present disclosure. Applicant notes that the embodiments and enabling technologies described previously herein in the context of the overlay metrology system 100 should be interpreted to extend to the method 500. It is further noted, however, that the method 500 is not limited to the architecture of the overlay metrology system 100.

In some embodiments, the method 500 includes a step 502 of illuminating a sample with one or more illumination beams (e.g., beams of illumination 116), each of the one or more illumination beams including two or more spectral bands having two or more center wavelengths. Further, the sample 106 in accordance with the metrology recipe may include one or more cells 202 (e.g., as part of an overlay target 104) with GoG structures 204 formed as overlapping gratings with different pitches in different sample layers.

In some embodiments, the method 500 includes a step 504 of generating one or more images of the sample with an illumination sub-system including components in a collection pupil to exclusively pass, for each of the two or more center wavelengths, two diffraction lobes from each of the different pitches of the grating-over-grating structures. In a general sense, any two diffraction lobes from each of the different pitches for each center wavelength may be used to generate the images. In some embodiments, the two diffraction lobes include a zero-order diffraction lobe and a single first-order diffraction lobe.

Further, the diffraction lobes may generally be located at any position as characterized by a collection pupil plane 306. In some embodiments, the center wavelengths, the pitches of the GoG structure 204, and the incidence angle of the illumination 116 are provided in a Littrow configuration such that the first-order diffraction lobes passed through the collection pupil plane 306 (e.g., by an aperture 320) are counterpropagate along the direction of the incident illumination 116.

The images generated in step 504 may further be generated from any number of collection channels 138. In some embodiments, light associated with different center wavelengths is directed into different collection channels 138 for the generation of separate images of each layer of the GoG structure 204.

In some embodiments, the method 500 includes a step 506 of generating one or more overlay measurements between at least some of the different layers of the sample based on the one or more images. Any suitable overlay algorithm may be used. For example, overlay may be determined based on centers of symmetry (CoS) of the constituent grating structures of a GoG structure 204 in the one or more images.

Further, different overlay algorithms may utilize information from different numbers of cells 202 of an overlay target 104. In some embodiments, an overlay target 104 includes a single cell 202 with a GoG structure 204 per measurement direction. In some embodiments, an overlay target 104 includes multiple cells 202, each with GoG structures 204 of the same or different designs per measurement direction.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   one or more illumination sources configured to generate illumination including two or more spectral bands having two or more center wavelengths;
   an optical sub-system including one or more lenses and one or more detectors configured to illuminate a sample with the illumination and image the sample in response to the illumination when implementing a metrology recipe, wherein the sample in accordance with the metrology recipe includes one or more cells with grating-over-grating structures formed as overlapping gratings with different pitches in different sample layers;
   wherein the optical sub-system includes components in a collection pupil plane to exclusively pass, for each of the two or more center wavelengths, two diffraction lobes from each of the different pitches of the grating-over-grating structures; and
   a controller including one or more processors configured to execute program instructions causing the one or more processors to implement the metrology recipe by:
      receiving one or more images of the sample from the one or more detectors generated in accordance with the metrology recipe; and
      generating one or more overlay measurements between at least some of the different sample layers based on the one or more images.

2. The overlay metrology system of claim 1, wherein the two diffraction lobes from each of the different pitches of the grating-over-grating structures associated with each of the two or more center wavelengths comprise:
   a zero-order diffraction lobe and a single first-order diffraction lobe.

3. The overlay metrology system of claim 1, wherein the illumination includes two illumination beams in a dipole configuration.

4. The overlay metrology system of claim 1, wherein the illumination includes four illumination beams in a quadrupole configuration.

5. The overlay metrology system of claim 1, wherein the one or more cells comprise:
   a first set of one or more cells, wherein the grating-over-grating structures in the first set of one or more cells have periodicities along a first measurement direction;
   a second set of one or more cells, wherein the grating-over-grating structures in the second set of one or more cells have periodicities along a second measurement direction.

6. The overlay metrology system of claim 1, wherein the components in the collection pupil plane to exclusively pass, for each of the two or more center wavelengths, two diffraction lobes from each of the different pitches of the grating-over-grating structures comprise:
   at least one of an annular aperture or a central obscuration.

7. The overlay metrology system of claim 1, wherein incidence angles of the illumination illumination beam on the sample and the grating-over-grating structures are configured in accordance with the metrology recipe in a Littrow configuration for selected combinations of the two or more center wavelengths and the pitches of constituent gratings in the grating-over-grating structures.

8. The overlay metrology system of claim 1, wherein the grating-over-grating structures include a first grating with a first pitch on a first layer of the sample and a second grating with a second pitch on a second layer of the sample, wherein the two or more center wavelengths include a first center wavelength and a second center wavelength, wherein the components of the collection pupil plane are configured to selectively pass a first-order diffraction lobe of the first center wavelength from the first grating and a first-order diffraction lobe of the second center wavelength from the second grating.

9. The overlay metrology system of claim 1, wherein the one or more detectors comprise:
   two or more detectors in separate imaging channels, wherein the optical sub-system further includes one or more wavelength-sensitive beamsplitters configured to separate light associated with the two or more spectral bands into the separate imaging channels.

10. An overlay metrology system comprising:
   a controller including one or more processors configured to execute program instructions causing the one or more processors to implement a metrology recipe by:
      receive one or more images of a sample generated in accordance with the metrology recipe from one or more detectors of an optical sub-system, wherein the sample in accordance with the metrology recipe includes one or more cells with grating-over-grating structures formed as overlapping gratings with different pitches in different sample layers, wherein the one or more images are generated in accordance with the metrology recipe based on illumination two or more spectral bands having two or more center wavelengths, wherein the optical sub-system includes components in a collection pupil plane to exclusively pass, for each of the two or more center wavelengths, two diffraction lobes from each of the different pitches of the grating-over-grating structures; and
      generate one or more overlay measurements between at least some of the different sample layers based on the one or more images.

11. The overlay metrology system of claim 10, wherein the two diffraction lobes from each of the different pitches of the grating-over-grating structures associated with each of the two or more center wavelengths comprise:
- a zero-order diffraction lobe and a single first-order diffraction lobe.

12. The overlay metrology system of claim 10, wherein the illumination includes two illumination beams in a dipole configuration.

13. The overlay metrology system of claim 10, wherein the illumination includes four illumination beams in a quadrupole configuration.

14. The overlay metrology system of claim 10, wherein the one or more cells comprise:
- a first set of one or more cells, wherein the grating-over-grating structures in the first set of one or more cells have periodicities along a first measurement direction;
- a second set of one or more cells, wherein the grating-over-grating structures in the second set of one or more cells have periodicities along a second measurement direction.

15. The overlay metrology system of claim 10, wherein the components in the collection pupil plane to exclusively pass, for each of the two or more center wavelengths, two diffraction lobes from each of the different pitches of the grating-over-grating structures comprise:
- at least one of an annular aperture or a central obscuration.

16. The overlay metrology system of claim 10, wherein incidence angles of the illumination on the sample and the grating-over-grating structures are configured in accordance with the metrology recipe in a Littrow configuration for selected combinations of the two or more center wavelengths and the pitches of constituent gratings in the grating-over-grating structures.

17. The overlay metrology system of claim 10, wherein the grating-over-grating structures include a first grating with a first pitch on a first layer of the sample and a second grating with a second pitch on a second layer of the sample, wherein the two or more center wavelengths include a first center wavelength and a second center wavelength, wherein the components of the collection pupil plane are configured to selectively pass a first-order diffraction lobe of the first center wavelength from the first grating and a first-order diffraction lobe of the second center wavelength from the second grating.

18. The overlay metrology system of claim 10, wherein the one or more detectors comprise:
- two or more detectors in separate imaging channels, wherein the optical sub-system further includes one or more wavelength-sensitive beamsplitters configured to separate light associated with the two or more spectral bands into the separate imaging channels.

19. A method, comprising:
- illuminating a sample with illumination including two or more spectral bands having two or more center wavelengths, wherein the sample in accordance with the metrology recipe includes one or more cells with grating-over-grating structures formed as overlapping gratings with different pitches in different sample layers;
- generating one or more images of the sample with an illumination sub-system including components in a collection pupil plane to exclusively pass, for each of the two or more center wavelengths, two diffraction lobes from each of the different pitches of the grating-over-grating structures; and
- generating one or more overlay measurements between at least some of the different sample layers based on the one or more images.

20. The method of claim 19, wherein generating the one or more images of the sample with the illumination sub-system including the components in the collection pupil plane to exclusively pass, for each of the two or more center wavelengths, two diffraction lobes from each of the different pitches of the grating-over-grating structures comprises:
- generating the one or more images of the sample with the illumination sub-system including the components in a collection pupil plane to exclusively pass, for each of the two or more center wavelengths, a zero-order diffraction lobe and a single first-order diffraction lobe from each of the different pitches of the grating-over-grating structures.

21. The method of claim 19, wherein generating the one or more images of the sample with the illumination sub-system including components in the collection pupil plane to exclusively pass, for each of the two or more center wavelengths, two diffraction lobes from each of the different pitches of the grating-over-grating structures comprises:
- exclusively passing to the one or more detectors, for each of the two or more center wavelengths, a zero-order diffraction lobe and a single first-order diffraction lobe from each of the different pitches of the grating-over-grating structures with at least one of an annular aperture or a central obscuration.

22. The method of claim 19, wherein illuminating the sample with the illumination comprises:
- illuminating the sample with two illumination beams in a dipole configuration.

23. The method of claim 19, wherein illuminating the sample with the illumination comprises:
- illuminating the sample with four illumination beams in a quadrupole configuration.

* * * * *